United States Patent [19]
Van Horn et al.

[11] Patent Number: 5,867,064
[45] Date of Patent: Feb. 2, 1999

[54] METHOD AND APPARATUS FOR IMPROVING INTERMODULATION IN A FEED-FORWARD AMPLIFIER

[75] Inventors: Mark I. Van Horn, Arlington; Joe Clark, Fort Worth; Leroy Plymale, Haltom City, all of Tex.

[73] Assignee: Motorola, Inc., Schaumburg, Ill.

[21] Appl. No.: 699,322

[22] Filed: Aug. 19, 1996

[51] Int. Cl.[6] .................................................... H03F 1/26
[52] U.S. Cl. ........................................ 330/149; 330/151
[58] Field of Search ............................. 330/52, 149, 151

[56] References Cited

U.S. PATENT DOCUMENTS 5,304,945  4/1994  Myer ................................. 330/151 X
5,386,198  1/1995  Ripstrand et al. ................ 330/151 X

*Primary Examiner*—Steven Mottola
*Attorney, Agent, or Firm*—Richard A. Sonnentag; Mario J. Donato, Jr.

[57] ABSTRACT

A feed-forward amplifier (600) has an error path (123) replaced by a feed-forward amplifier (603) in a nested feed-forward configuration. By replacing the error path (123) with the feed-forward amplifier (603), design parameters such as efficiency and power output which are difficult to achieve with the conventional error path (123) are easily achieved with the single loop feed-forward amplifier (603). In this configuration, the main path (613) of the feed-forward amplifier (603) is capable of operating in a more efficient Class AB mode while still operating over a large dynamic range with to provide a relatively constant gain/phase relationship, thus insuring good intermodulation performance. The error path (627) of the feed-forward amplifier (603) must still be biased Class A, but it's requirements are much less than those of a Class A error amplifier (124) in an un-nested configuration.

15 Claims, 7 Drawing Sheets

METHOD AND APPARATUS FOR IMPROVING INTERMODULATION IN A FEED-FORWARD AMPLIFIER

FIELD OF THE INVENTION

The present invention relates generally to feed-forward amplifiers and more particularly, to improving intermodulation (IM) performance in such feed-forward amplifiers.

BACKGROUND OF THE INVENTION

Current feed-forward linear power amplifiers (LPAs) have a significant burst intermodulation (IM) problem when they are operated at high output power levels. This problem is due to the limited output power capability of the error amplifiers within the feed-forward loop. To help explain the problem, reference is made to a prior art feed-forward amplifier as shown in FIG. 1. Referring to FIG. 1, a signal 101 is input into a radio frequency (RF) coupler 103 which has as an output a signal entering a main gain/phase control block 106. Output from the block 106 is input into a main amp 109 which has an output into another RF coupler 112. In the preferred embodiment, the main amp 109 is a Class AB amplifier as is well known in the art. The main gain/phase control block 106 and the main amp 109 generally comprise a main path 107 for the signal 101 to propagate.

Also output from the RF coupler 103 is a signal which enters a main delay block 115. The amount of time delay presented by the main delay block 115 is approximately equal to the amount of time delay the input signal 101 experiences as it propagates through the main path 107. The signal exiting the main delay block 115 enters RF coupler 118. Also input into RF coupler 118 is an output from RF coupler 112. Each signal entering RF coupler 118 is phased such that the main signal component in each of the input signals will be canceled, thus leaving (theoretically) only an error signal 119 exiting the RF coupler 118.

The error signal 119 exiting the RF coupler 118 is input into an error path 123 which generally comprises an error gain/phase control 121 and an error amplifier 124. In the preferred embodiment, the error amp 124 is a Class A amplifier as is well known in the art. The error gain/phase control block 121 provides fine tune adjustment of both the gain and the phase of the error signal 119 exiting the RF coupler 118. Exiting the error amp 124 is thus an error signal which has been gain and phase controlled.

The signal exiting the RF coupler 112 is a signal which contains both a main signal component and an error component, and this signal is input into an error delay block 127 which provides a time delay which is substantially equal to the time delay the error signal 119 experiences as it propagates through the error path 123. The signal exiting the error delay block 127 is input into the RF coupler 130, as is the gain and phase controlled error signal exiting the error amplifier 124. Again, each signal entering the RF coupler 130 is phased such that the two signals entering the RF coupler 130 will be combined such that the error signal is substantially canceled. Thus, the output signal 131 exiting the RF coupler 130 has (theoretically) only the main component of the original input signal 101 therein.

The IM products seen in the output signal 131 are statistical in nature, and have a peak to average ratio that is proportional to the statistics of the envelope of the broadband input signal. The "burst" IM problem can be quantified by looking at the cumulative distribution function (CDF) of samples of a particular IM product. For example, FIG. 2 shows the CDF of a LPA operated with varying output power levels. The burst IM problem shows up as a slope change of the CDF curve in that the change in slope is indicative of a relatively good "average IM" value that has lower percent probability IM that is considerably worse. For example, the IM level with a probability of a 0.1% occurrence is ~–56 dBc for 50 W and –30 dBc for 100 W. The same curves show that at the 10% probability level the IM is worse than 64 dBc or –60 dBc; a difference of 4 dBc at high probability levels compared to the 26 dBc difference at lower probability levels. The slope change in the CDF curve has been experimentally determined to be caused by the error amplifiers themselves. To eliminate the problem completely requires a large amount of back-off in the error amplifiers. This large amount of backoff makes the error amplifier prohibitively large and inefficient.

Two main factors in the performance of multi-carrier LPAs force this back-off requirement. The first factor requiring error amplifier back-off is the peak to average nature of the envelope that generates the IM. In multi-carrier systems, the peak-to-average ratio of an envelope is determined by the relative phases of the multi-carrier input signal as well as the modulation itself in digital modulation schemes. For FM carriers, the absolute maximum peak signal is 10 Log of the number of carriers. The peak-to-average ratio of an envelope is also a statistical phenomenon. FIG. 3 depicts theoretical CDF curves for multi-carrier FM input signals. A general rule of thumb is that 10 dB is sufficient peak-to-average ratio for any statistically significant peak. The first factor alone will require approximately 10 dB of back-off in the error amplifiers due to peaking from the average level.

The second factor requiring error amplifier back-off is the degradation of the carrier cancellation in coupler 118 due to the amplitude modulation-amplitude modulation (AM—AM) distortion and amplitude modulation-phase modulation (AM-PM) distortion of the main amplifier. The error signal 119 presented to the error path 123 consists of the IM products (error signal) plus the residual of the canceled carriers. Carrier cancellation is typically assumed to be on the order of 30 dB, and this carrier cancellation and the IM performance of the main amplifier 109 can be used to "size" the error amplifier 124. The amount of carrier cancellation is determined by the amount of amplitude and phase error in the cancellation circuitry, where the magnitude and phase errors of the cancellation circuitry operate over the same dynamic range as the input signal 101. The magnitude and phase error in the cancellation circuitry is determined by both the deviations due to frequency and the magnitude of the input signal 101.

The AM—AM and AM-PM of the main amplifier 109 contributes directly to the amount of carrier cancellation. In the conventional feed-forward amplifier as shown in FIG. 1, the main amplifier 109 is biased Class AB in order to maintain efficiency with the amount of back-off needed for the required peak-to-average ratio of the input signal 101. A response for a typical amplifier biased Class AB is shown in FIG. 4. Important to note is that the amplifier undergoes considerable AM—AM and AM-PM over a 10 dB signal range. The main amplifier in FIG. 4 operated to 1 dB compression point on envelope peaks could typically produce a 1 dB amplitude error (1 dB compression by definition) but also on the order of 10 degrees of phase shift (note the phase shift from the curve end point to 10 dB or 5 divisions earlier on the x-axis of FIG. 4). By using these values to reference the curves of constant carrier cancellation verses phase and amplitude errors shown in FIG. 5, the carrier cancellation is determined to be less then 15 dB. This degraded carrier cancellation from average signal levels must be included in the error amplifier back-off. This corresponds to a large dynamic range requirement of 25 dB in the error amplifier 124.

Thus, a need exists for a improved feed-forward amplifier which overcomes the shortcomings mentioned above.

DETAILED DESCRIPTION OF A PREFERRED EMBODIMENT

Figure 6:
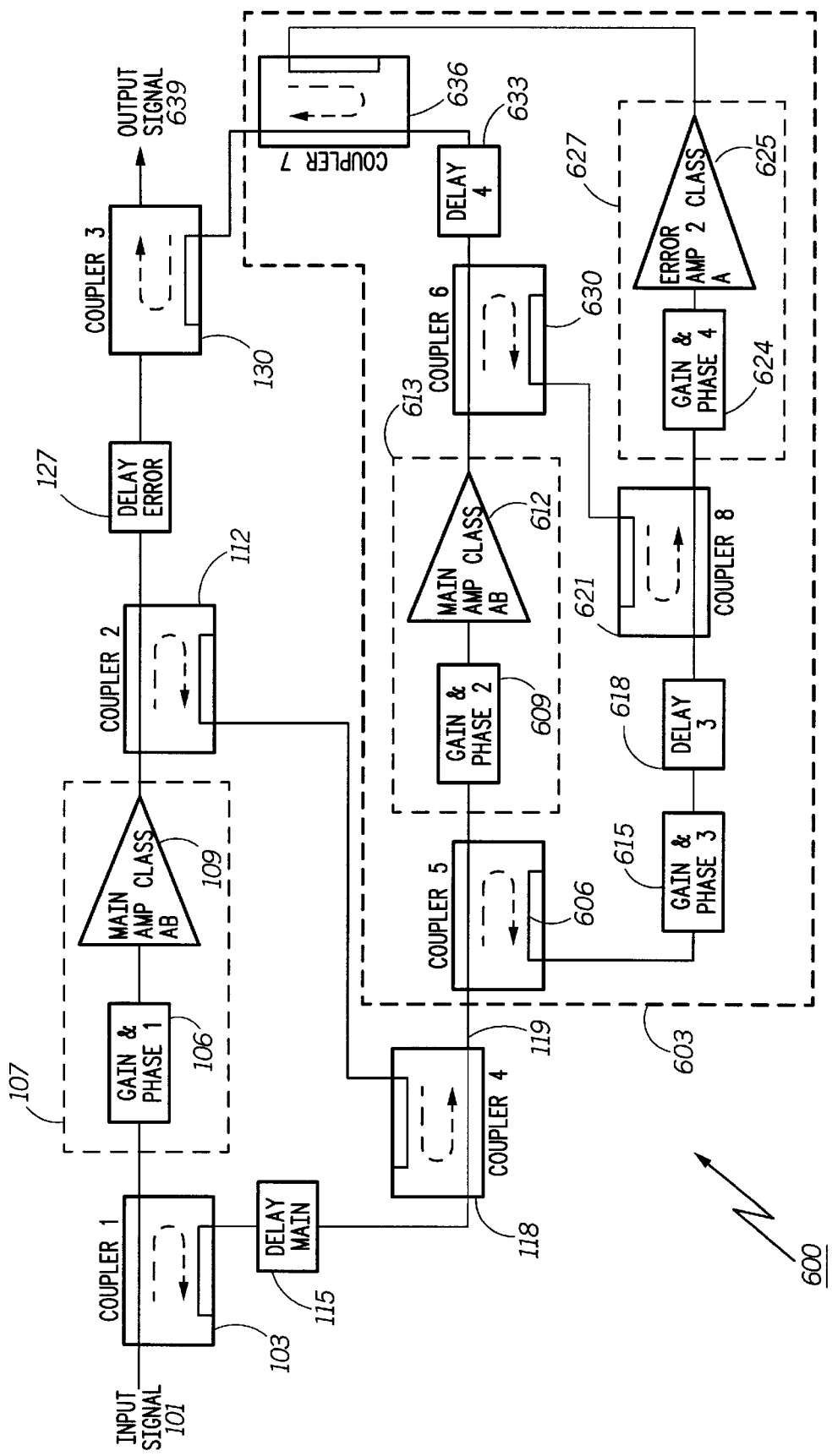
FIG. 6 generally depicts a nested feed-forward amplifier configuration in accordance with the invention.

Stated generally, with reference to FIG. 6, a feed-forward amplifier 600 has an error path 123 replaced by a feed-forward amplifier 603 in accordance with the invention. By replacing the error path 123 with the feed-forward amplifier 603, design parameters such as efficiency and power output which are difficult to achieve with the conventional error path 123 are easily achieved with the single loop feed-forward amplifier 603. In this configuration, the main path 613 of the feed-forward amplifier 603 is capable of operating in a more efficient Class AB mode while still operating over a large dynamic range with to provide a relatively constant gain/phase relationship, thus insuring good intermodulation performance. The error path 627 of the feed-forward amplifier 603 must still be biased Class A, but it's requirements are much less than those of a Class A error amplifier 124 in an un-nested configuration as will be explained below.

Stated more specifically, a feed-forward amplifier comprises a main path for amplifying a carrier portion and an error portion of an input signal and a feed-forward amplifier, coupled to the main path, for canceling the error portion from the input signal to produce an output signal having the carrier portion substantially thereon. In the preferred embodiment, the second feed-forward amplifier includes a main path and error path. Also in the preferred embodiment, the main path of the second feed-forward amplifier includes an amplifier biased Class AB, the error path of the second feed-forward amplifier includes an amplifier biased Class A and the second feed-forward amplifier is coupled to an output of the main path. In an alternate embodiment, the second feed-forward amplifier and the output of the main path have a Class A biased amplifier coupled therebetween.

Figure 1:
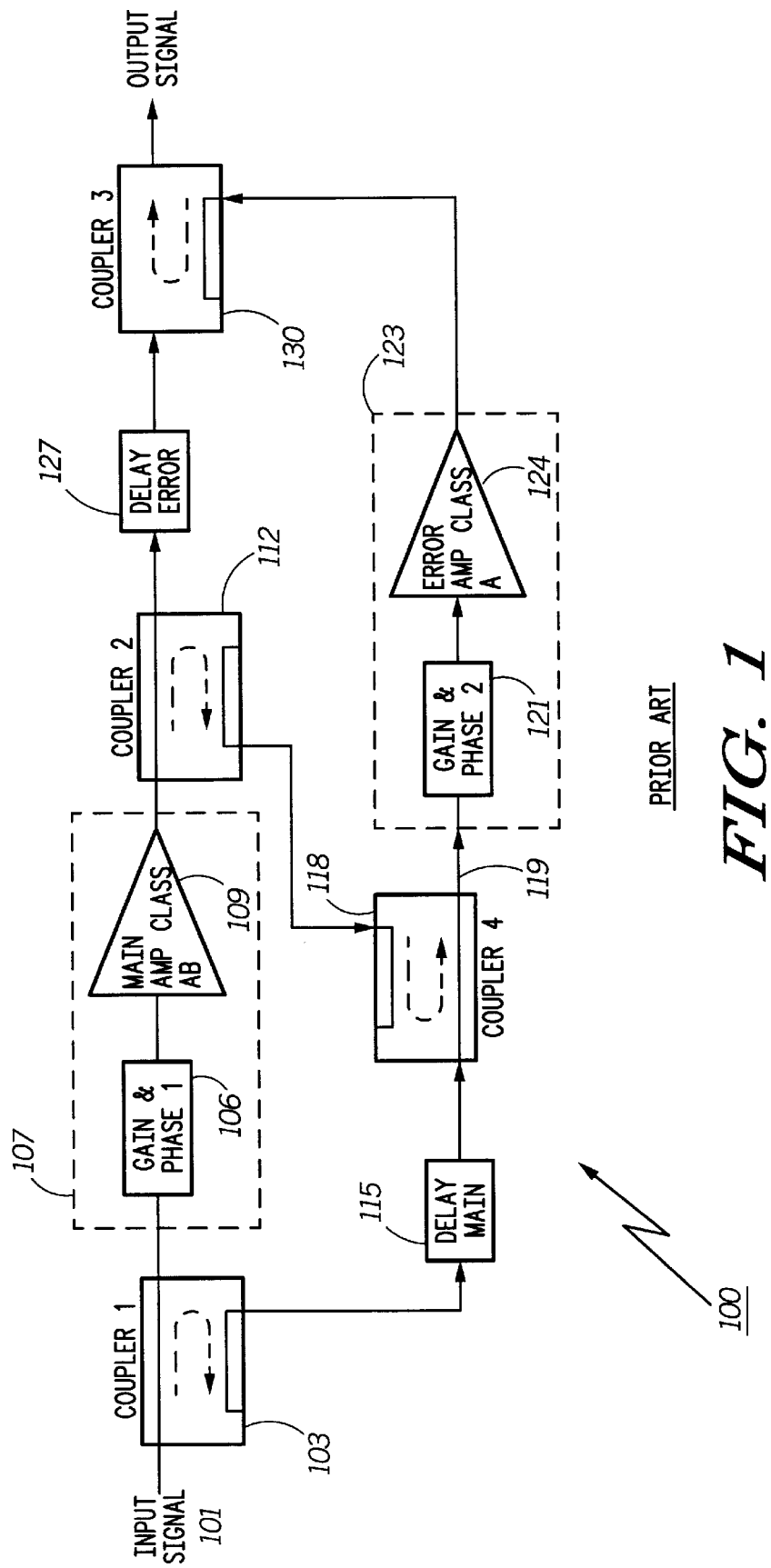
FIG. 1 generally depicts a prior art feed-forward amplifier.
Figure 2:
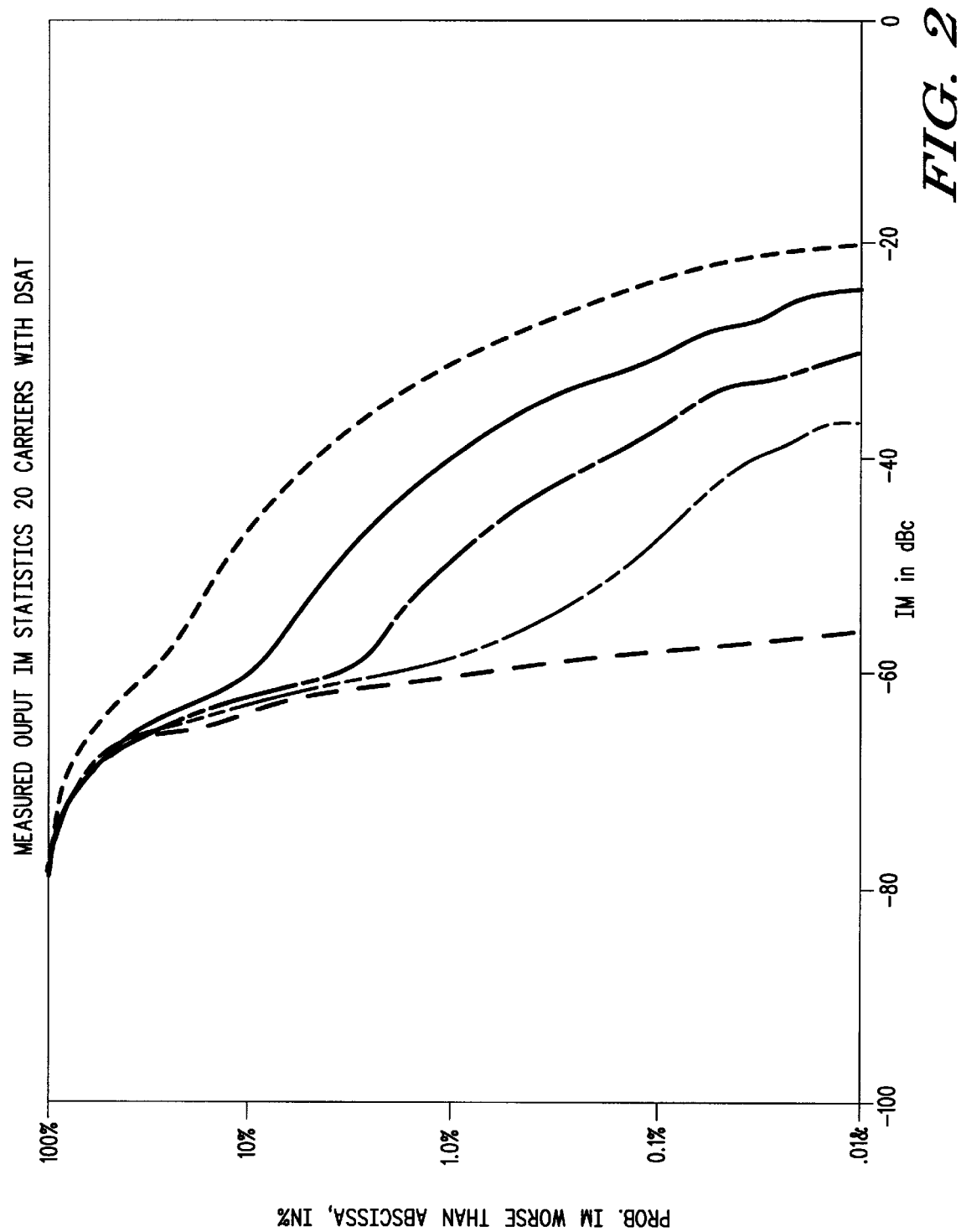
FIG. 2 generally depicts a cumulative distribution function (CDF) of the IM generated in a linear power amplifier (LPA) operated at various output power levels.
Figure 3:
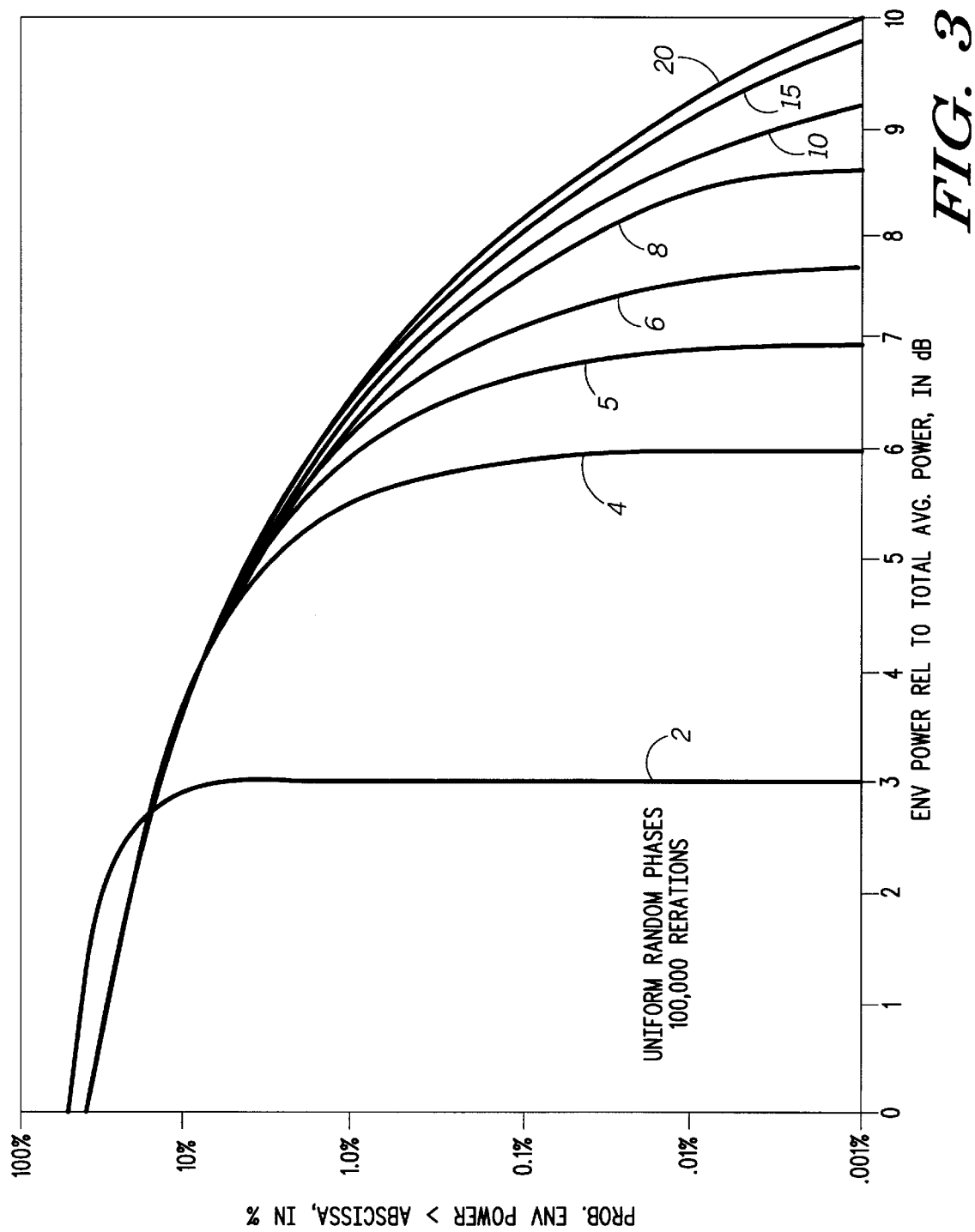
FIG. 3 generally depicts theoretical CDF curves of the peak to average envelope for multi-carrier FM input signals.
Figure 4:
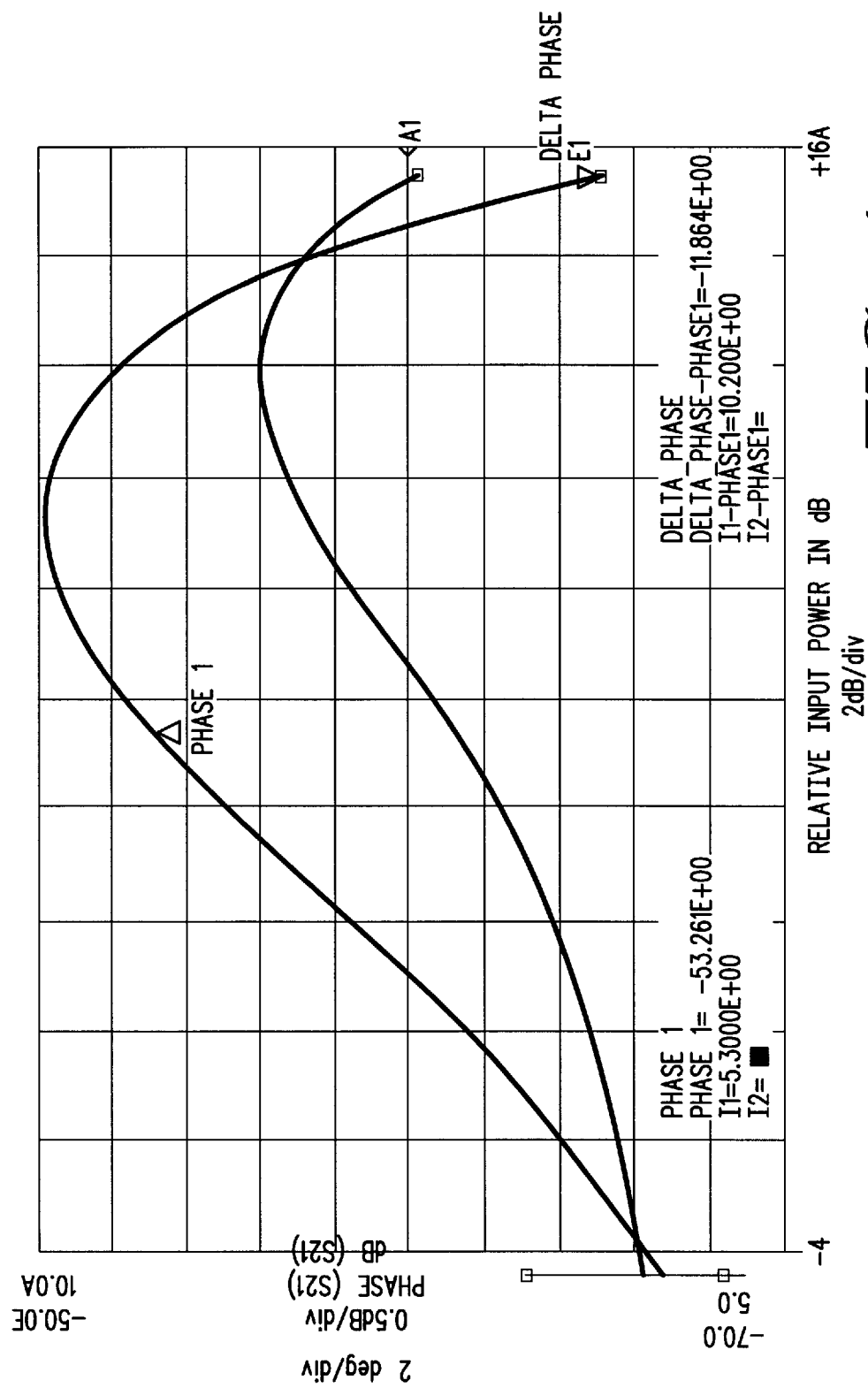
FIG. 4 generally depicts AM—AM and AM-PM response for a typical amplifier biased Class AB.
Figure 5:
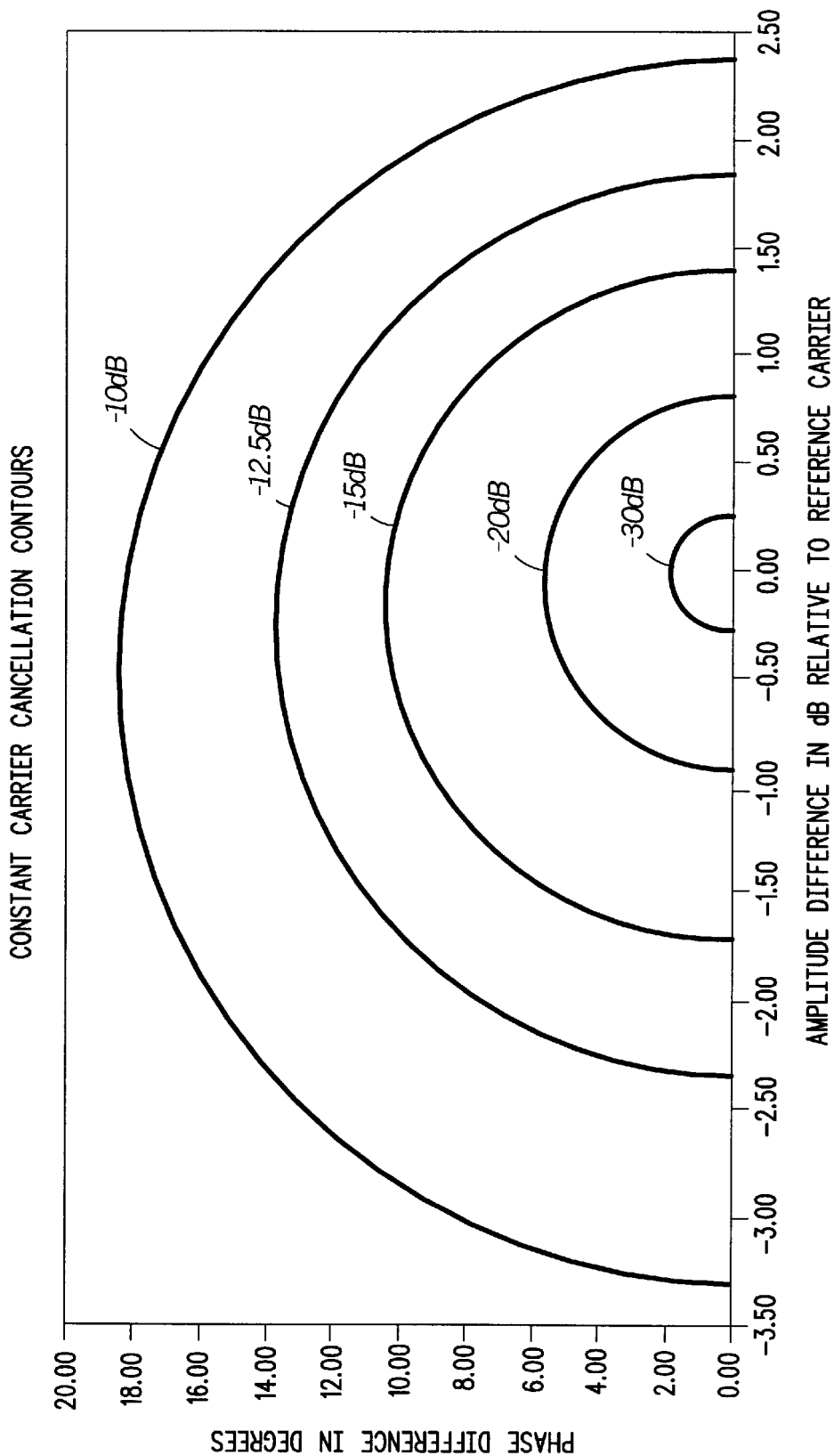
FIG. 5 generally depicts curves of constant carrier cancellation verses phase and amplitude errors.

FIG. 6 depicts the preferred embodiment of a nested feed-forward linear power amplifier (LPA) in accordance with the invention. As shown in FIG. 6, the error path 123 of the prior art feed-forward amplifier of FIG. 1 is replaced with a second feed-forward amplifier 603 to produce the inventive nested feed-forward amplifier 600. In this embodiment, the second feed-forward amplifier 603 comprises couplers 606, 621, 630 and 636, Gain & Phase blocks 609, 615 and 624, Main Error Amp 612, Delay Blocks 618 and 633, and Error Amp 625 as shown in FIG. 6. The second feed-forward amplifier 603 is substantially the same as the prior art feed-forward amplifier 100, but for the addition of the Gain & Phase block 615. In the preferred embodiment, the Main Error Amp 612 and the Error Amp 625 are biased Class AB and Class A respectively.

As is clear from above, the individual circuit performance requirements are greatly reduced while the performance of the entire feed-forward LPA 600 are improved. The IM products present in the output signals 131 or 639 created by the error path (i.e., whether it is a nested as shown in FIG. 6 or conventional as shown in FIG. 1) will be equal to the IM of the error amplifier (in dBc) minus the amount of carrier cancellation. As such, the IM contributed by the error path 127 should be designed to be less than the corrected main amplifier IM. For example, if an overall IM performance of −60 dBc is desired, the contribution of the error path 127 in the prior art feed-forward amplifier 100 could be designed to be below this level by a margin of 5 dB. For a goal of −65 dBc IM contributed by the error path 127 (assuming 5 dB margin) with an expected carrier cancellation of only 15 dB worst case (peak after considering main amplifier AM-PM), the IM required is 50 dBc. While this IM specification is difficult to achieve with the error path 127 of FIG. 1 consisting of a class A amplifier as in a normal feed-forward amplifier, this specification is not very difficult to achieve with the feed-forward amplifier 603 shown in FIG. 6. The error amplifier 625 would then require 40 dBc IM performance if the carrier cancellation is again 15 dB worst case (again with 5 dB of margin from its contribution). This represents a 10 dB improvement in the requirements of the error amplifier. If the IM is allowed to be worse then −60 dBc for a small percentage of the time, the specifications for the individual blocks is reduced even further.

The feed-forward amplifier in accordance with the invention need not include the entire error amplifier path as shown in FIG. 6. In FIG. 6, the lower power error amplifier stages, pre-error stages 703, may be run sufficiently linear class A without significantly sacrificing overall efficiency. The higher power error amplifier stages, main error amplifier 612, are "nested" in a feedforward loop. The error amplifier 603 could then be much simpler, with fewer stages, as the gain requirements would be lower then feedforward correcting the entire error amplifier path, 603 and 703. The delays presented by blocks 127 and 633 would also be smaller and easier to match since they would be used to account for fewer gain stages in block 603.

Figure 7:
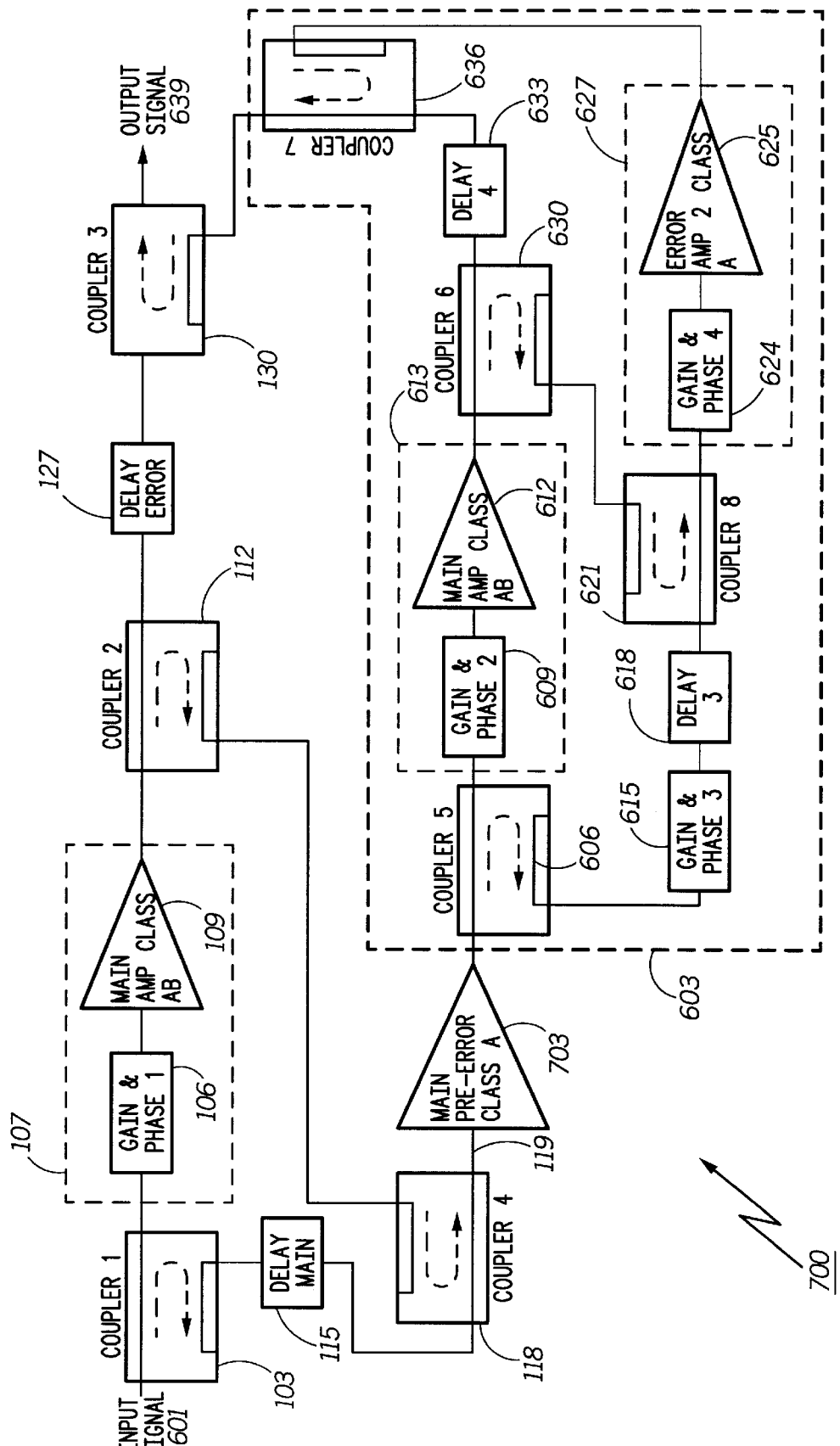
FIG. 7 generally depicts an alternate embodiment nested feed-forward amplifier configuration in accordance with the invention.

Another variation on this scheme is to implement the FF corrected error amplifier in what has been called a class 2 LPA. This is an amplifier where the carrier cancellation is purposely reduced in magnitude so that the error amplifier adds significant power to the output. This in effect reduces the main path losses in the error coupler (coupler 130 in FIG. 6 and FIG. 7). Various combinations of main, main error and error 2 amplifiers can be used to provide different levels of burst IM performance and efficiency. The schematic diagram for this implementation is the same; the difference is in the tuning of the loops.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What we claim is:

1. A feed-forward amplifier comprising:

a main amplifier, the main amplifier being a non-feed-forward amplifier having a main path for amplifying a carrier portion and an error portion of an input signal; and a second feed-forward amplifier, the second feed-forward amplifier including an error amplifier which is itself a feed-forward amplifier, the main amplifier being coupled, in a feed-forward arrangement, to the error amplifier via the main path, for canceling the error portion from the input signal to produce an output signal having the carrier portion substantially thereon.

2. The feed-forward amplifier of claim 1, wherein the second feed-forward amplifier includes a main path and error path.

3. The feed-forward amplifier of claim 2, wherein the main path of the second feed-forward amplifier includes an amplifier biased either Class A or Class AB.

4. The feed-forward amplifier of claim 2, wherein the error path of the second feed-forward amplifier includes an amplifier biased either Class A or Class AB.

5. The feed-forward amplifier of claim 1, wherein the second feed-forward amplifier has as an input an output of the main path.

6. The feed-forward amplifier of claim 5, wherein the second feed-forward amplifier and the output of the main path have an amplifier biased either Class A or Class AB coupled therebetween, the amplifier being coupled in series to a feed-forward corrected portion of an error path of the second feed-forward amplifier.

7. A feed-forward amplifier comprising:

a main amplifier, the main amplifier being a non-feed-forward amplifier having a first main path for amplifying a carrier portion and an error portion of an input signal to produce an output signal; and a second feed-forward amplifier, the second feed-forward amplifier including an error amplifier which is itself a feed-forward amplifier, the main amplifier being coupled, in a feed-forward arrangement, to the error amplifier via the main path, the second feed-forward amplifier including a second main path and an error path, for canceling the error portion from the input signal to produce an output signal having the carrier portion substantially thereon.

8. The feed-forward amplifier of claim 7, wherein the first and second main paths and the error path include amplifiers biased either Class A or Class AB.

9. The feed-forward amplifier of claim 7, wherein the second feed-forward amplifier has as an input an output of the main path.

10. The feed-forward amplifier of claim 9, wherein the second feed-forward amplifier and the output of the main path have an amplifier biased either Class A or Class AB coupled therebetween, the amplifier being coupled in series to a feed-forward corrected portion of the error path of the second feed-forward amplifier.

11. A feed-forward amplifier comprising:

a first main path having a first amplifier, the first amplifier being a non-feed-forward amplifier for amplifying a carrier portion and an error portion of an input signal to produce a first output signal;

a second amplifier, coupled in a feed-forward arrangement to the first amplifier, for amplifying the first output signal to produce an amplified first output signal; and a second feed-forward amplifier coupled, in a feed-forward arrangement, to the first amplifier and having as an input the amplified first output signal, the second feed-forward amplifier including a second main path having a third amplifier and an error path having an error amplifier, the second amplifier being coupled in series to a feed-forward corrected portion of the error path, the second feed-forward amplifier canceling the error portion from the amplified first output signal to produce a second output signal having the carrier portion substantially thereon.

12. The feed-forward amplifier of claim 11, wherein the first, second, third and error amplifiers are biased either Class A or Class AB.

13. A method of improving intermodulation in a feed-forward amplifier, the method comprising the steps of:

amplifying, via a first non-feed-forward amplifier, a carrier portion and an error portion of an input signal to produce a first output signal;

amplifying, via a second amplifier coupled in a feed-forward arrangement to the first amplifier, the first output signal to produce an amplified first output signal; and canceling, via a second feed-forward amplifier coupled in a feed-forward arrangement to the first amplifier, the error portion from the amplified first output signal to produce a second output signal having the carrier portion substantially thereon.

14. The method of claim 13, wherein the second feed-forward amplifier includes a second main path having a third amplifier and an error path having an error amplifier, the second amplifier being coupled in series to a feed-forward corrected portion of the error path.

15. The method of claim 14, wherein the first, second, third and error amplifiers are biased either Class A or Class AB.

* * * * *